US007713832B2

United States Patent
Kim

(10) Patent No.: US 7,713,832 B2
(45) Date of Patent: May 11, 2010

(54) SEMICONDUCTOR DEVICE AND METHOD OF FABRICATING THE SAME

(75) Inventor: Young Deuk Kim, Icheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 154 days.

(21) Appl. No.: 11/987,759

(22) Filed: Dec. 4, 2007

(65) Prior Publication Data

US 2009/0001516 A1    Jan. 1, 2009

(30) Foreign Application Priority Data

Jun. 29, 2007 (KR) ...................... 10-2007-0065544

(51) Int. Cl.
*H01L 21/20* (2006.01)

(52) U.S. Cl. ...................... 438/397; 438/691; 257/534; 257/E21.018

(58) Field of Classification Search ........................ None
See application file for complete search history.

(56) References Cited

U.S. PATENT DOCUMENTS

2003/0227044 A1\* 12/2003 Park ............................ 257/301
2005/0221574 A1\* 10/2005 Ahn et al. .................... 438/386
2006/0046382 A1\* 3/2006 Yoon et al. ................... 438/254

FOREIGN PATENT DOCUMENTS

| KR | 1020030093817 A | 12/2003 |
| KR | 1020040000069 A | 1/2004 |
| KR | 1020060007727 A | 1/2006 |
| KR | 1020060009995 A | 2/2006 |

\* cited by examiner

*Primary Examiner*—Thanh V Pham
*Assistant Examiner*—Andres Munoz
(74) *Attorney, Agent, or Firm*—IP & T Law Firm PLC

(57) ABSTRACT

A method of fabricating a semiconductor device includes forming an interlayer insulating pattern over a semiconductor substrate. The interlayer insulating pattern defines a plurality of storage node regions. A lining conductive film is formed over the interlayer insulating pattern including the storage node region. A capping insulating film is formed over the lining conductive film. The capping insulating film over the interlayer insulating film and the lining conductive film are selectively etched between two neighboring storage node regions to form a recess exposing the interlayer insulating pattern on the bottom of the recess and the lining conductive film on sidewalls of the recess. The capping insulating film and the lining conductive film is shaped to be planar so that the lining conductive layer is electrically separated from each other to form a respective lower storage electrode. A supporting pattern is formed to fill the recess. The capping insulating film and the interlayer insulating pattern are removed to expose the lower storage node.

6 Claims, 9 Drawing Sheets

(i)

(ii)

SEMICONDUCTOR DEVICE AND METHOD OF FABRICATING THE SAME

This application is based upon and claims the benefit of priority to Korean Patent Application No. 10-2007-0065544, filed on Jun. 29, 2007, the entire contents of which are incorporated herein by reference.

TECHNICAL FIELD

The invention generally relates to a semiconductor device. More particularly, the invention relates to a semiconductor device including a capacitor and a method of fabricating the same.

BACKGROUND

As a semiconductor device is smaller and highly integrated, the memory capability is increased. However, the high integration of the device increases a chip area but decreases a cell area. The reduction of the cell area decreases an area of a cell capacitor. As a result, the read-out capability of the cell is reduced, the durability is degraded by soft errors of alpha particles, and a sensing margin of a sense amplifier is decreased. Therefore, a method for securing a sufficient capacitance in a limited cell region has been required.

The capacitance refers to a capacity of charges stored in a capacitor. As the capacitance becomes larger, more information can be stored. The capacitance is represented by Equation 1.

$$C = \varepsilon \frac{A}{d} \qquad \text{Equation 1}$$

$\varepsilon$ is a dielectric constant determined by kinds of dielectric films disposed between two electrodes, d is a distance between the two electrodes, and A is an effective surface of the two electrodes. Referring to Equation 1, as $\varepsilon$ is larger, d is shorter between the two electrodes and A of the two electrodes is increased, the capacitance of the capacitor can be increased. The electrode structure of the capacitor is changed to have a three-dimensional type such as a concave structure and a cylinder structure, thereby increasing the effective area of the electrodes.

FIGS. 1a to 1f are cross-sectional views illustrating a conventional method of fabricating a semiconductor device. A buffer oxide film 110, an etch stop film 115, an interlayer insulating film 130, an amorphous carbon layer 140, a silicon nitride oxide film 150 and an anti-reflection film 160 are sequentially formed over a semiconductor substrate 100 including a storage node contact plug 105. A photoresist pattern 170 is formed over anti-reflection film 160 to define a storage node region. Etch stop film 115 includes a nitride film.

Referring to FIG. 1b, anti-reflection film 160 and amorphous carbon layer 140 are sequentially etched using photoresist pattern 170. Interlayer insulating film 130 is etched using the etched silicon nitride oxide film 150 and the etched amorphous carbon layer 140 as an etching mask to form an interlayer insulating pattern 130a that exposes etch stop film 115. Photoresist pattern 170 and anti-reflection film 160 are removed.

Referring to FIGS. 1c and 1d, etch stop film 115 and buffer oxide film 110 are etched using interlayer insulating pattern 130a as an etching mask to form a storage node region 180 exposing storage node contact plug 105. Since buffer oxide film 110 is removed when etch stop film 115 is etched, an over-etching method may be performed. A conductive film 175 is formed over storage node contact plug 105, buffer oxide film 110, etch stop film 115, interlayer insulating pattern 130a, amorphous carbon layer 140 and silicon nitride oxide film 150. Conductive film 175 includes a titanium nitride film.

Referring to FIGS. 1e and 1f, a planarization process is performed on conductive film 175 until interlayer insulating pattern 130a is exposed. A dip-out process is performed to remove interlayer insulating pattern 130a, thereby forming a lower storage node of the cylinder structure.

However, a leaning phenomenon of the lower storage node during the dip-out process occurs by a surface tension of a wet solution, and the lower storage node is pulled out to cause dropping defects, thereby degrading characteristics of the device.

SUMMARY

Embodiments of the invention are directed to a semiconductor device. According to an embodiment of the invention, the semiconductor device includes a supporting pattern formed between lower storage nodes to prevent a leaning phenomenon of the lower storage node in a dip-out process, thereby improving reliability and yield of the device.

According to an embodiment of the invention, a method of fabricating a semiconductor device includes forming an interlayer insulating pattern over a semiconductor substrate. The interlayer insulating pattern defines a plurality of storage node regions. A lining conductive film is formed over the interlayer insulating pattern including the storage node region. A capping insulating film is formed over the lining conductive film. The capping insulating film over the interlayer insulating pattern and the lining conductive film are selectively etched to form a recess exposing the interlayer insulating pattern on the bottom of the recess and the lining conductive film on sidewalls of the recess. The capping insulating film and the conductive film are shaped to be planar so that the lining conductive layer is electrically separated from each other to form a respective lower storage electrode. A supporting pattern is formed to fill the recess. The capping insulating film and the interlayer insulating pattern are removed to expose the lower storage node.

According to an embodiment of the invention, a semiconductor device is manufactured by the above described method.

DETAILED DESCRIPTION

The invention relates to a method of fabricating a semiconductor device. In one embodiment of the invention, the method includes forming a supporting pattern to prevent leaning phenomenon of a lower storage node.

Figure 1A:
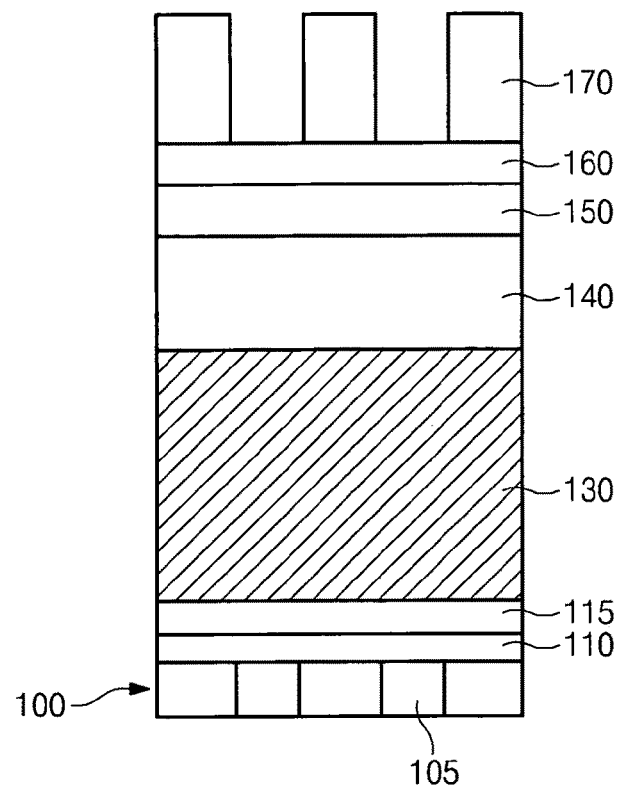
FIGS. 1a to 1f are cross-sectional views illustrating a conventional method of fabricating a semiconductor device.
Figure 1B:
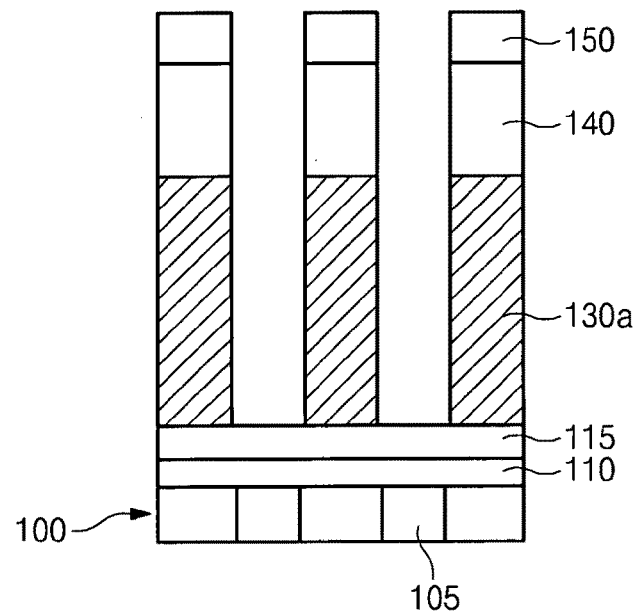
Figure 1C:
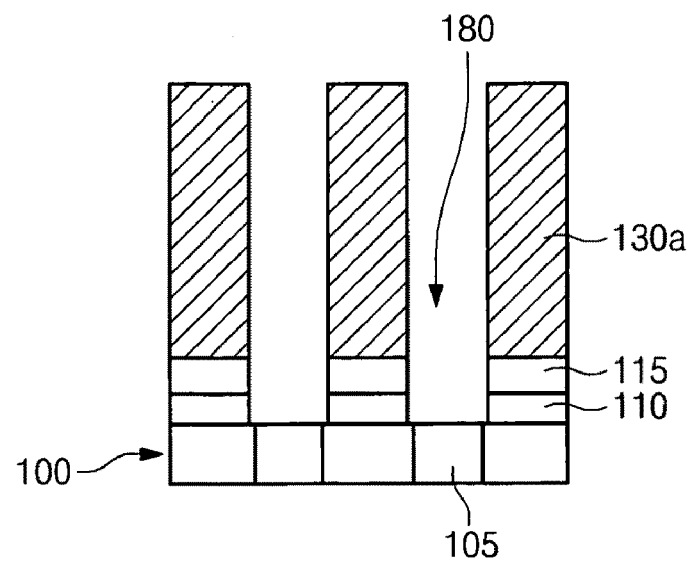
Figure 1D:
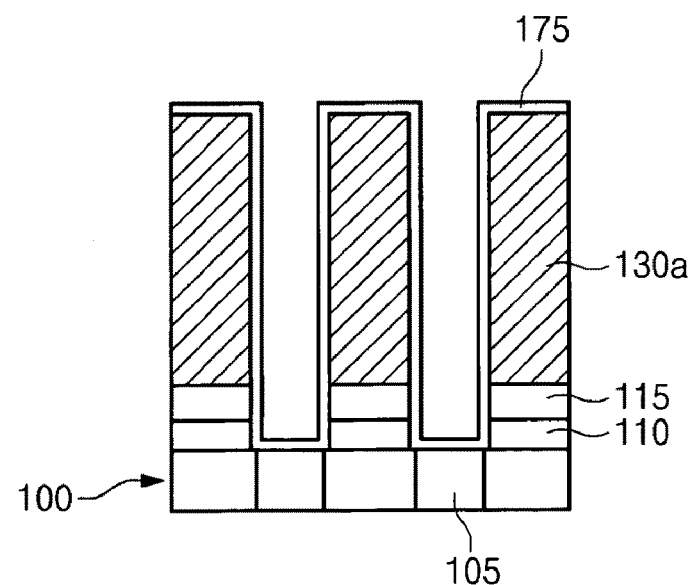
Figure 1E:
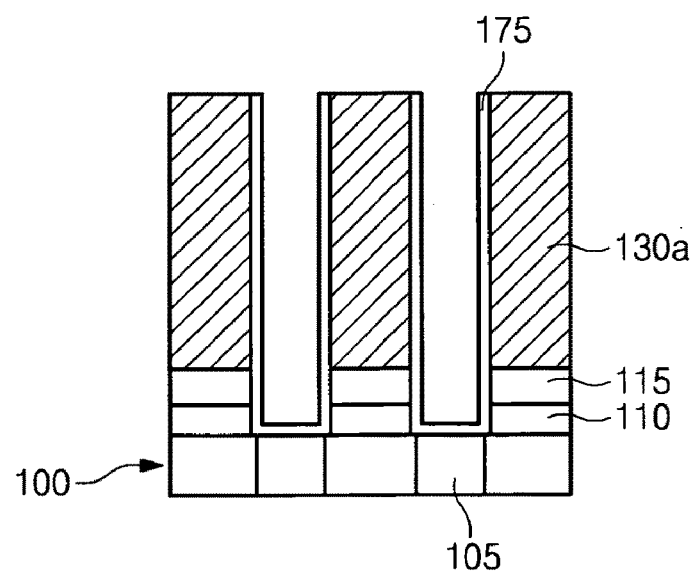
Figure 1F:
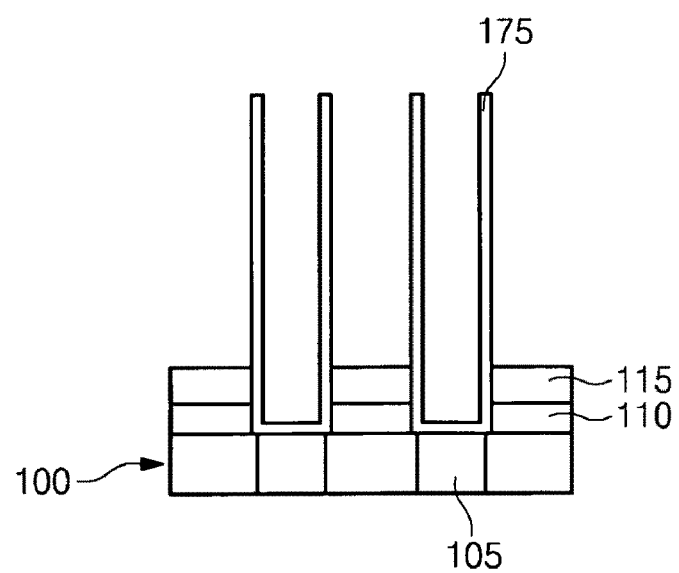
Figure 2:
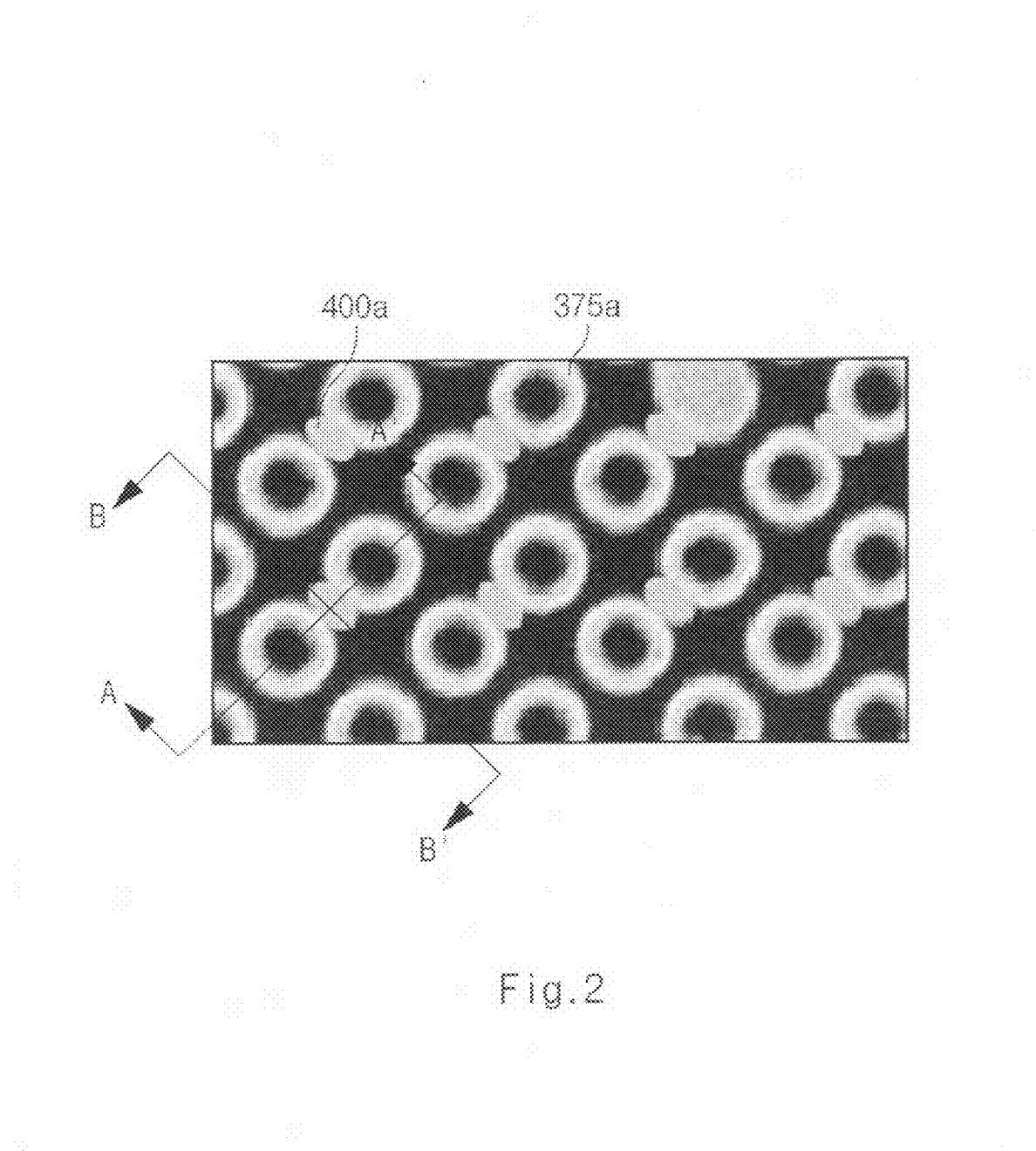
FIG. 2 is a top-view photograph illustrating a semiconductor device according to an embodiment consistent with the invention.

FIG. 2 is a top-view photograph illustrating a semiconductor device according to an embodiment of the invention. The semiconductor device includes a plurality of cylinder-type lower storage nodes 375 and a supporting pattern 400 between lower storage nodes 375. Supporting pattern 400 serves a supporter of lower storage node 375, thereby preventing a leaning phenomenon of lower storage node 375 in a dip-out process. Supporting pattern 400 is arranged alternately between lower storage nodes 375.

Figure 3A:
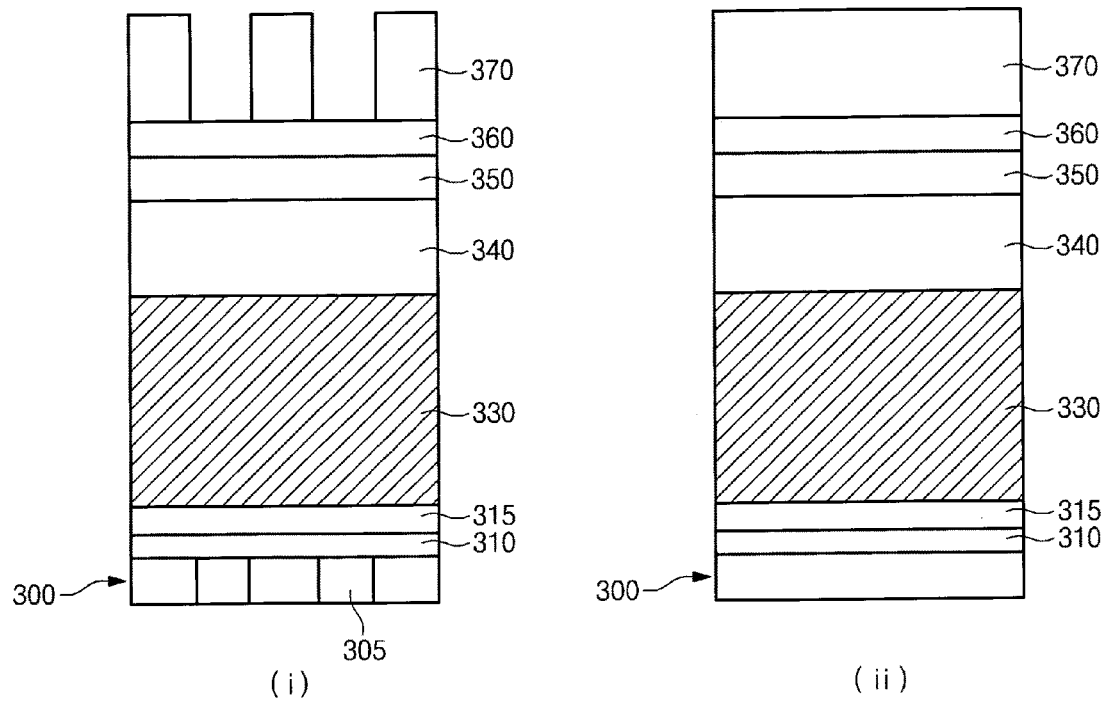
FIGS. 3a to 3i are cross-sectional views illustrating a method of fabricating a semiconductor device according to an embodiment consistent with the invention.

FIGS. 3a to 3i are cross-sectional views illustrating a method of fabricating a semiconductor device according to an embodiment of the invention. FIGS. 3a(i) to 3i(i) are cross-sectional views taken along A-A', and FIGS. 3a(ii) to 3i(ii) are cross-sectional views taken along B-B'. A buffer oxide film 310, an etch stop film 315, an interlayer insulating film 330, a hard mask layer 340 and an anti-reflection film 360 are sequentially formed over a semiconductor substrate 300 including a storage node contact plug 305. Buffer insulating film 310 includes an oxide film. Etch stop film 315 includes a nitride film in a range of about 500 Å to about 700 Å.

Interlayer insulating film 330 is selected from the group consisting of a phosphorous-silicate-glass ("PSG") oxide film, a plasma enhanced tetra-ethyl-ortho-silicate glass ("PE-TEOS") oxide film and a combination thereof. A thickness of interlayer insulating film 330 is adjusted depending on a height of the lower storage node. For example, interlayer insulating film 330 has a thickness in a range of about 6,000 Å to about 8,000 Å.

Hard mask layer 340 includes an amorphous carbon layer. A silicon oxynitride (SiON) film 350 is formed between hard mask layer 340 and anti-reflection film 360. A photoresist film (not shown) is formed over anti-reflection film 360. The photoresist film is exposed and developed using a storage node mask (not shown) to form a first photoresist pattern 370 to define a storage node region.

Figure 3B:
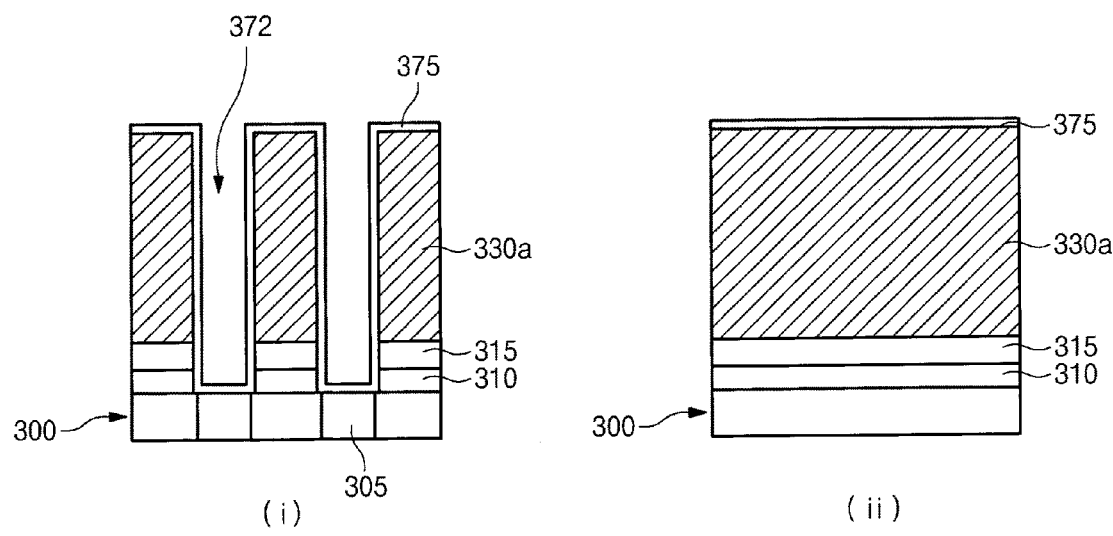

Referring to FIG. 3b, anti-reflection film 360, silicon nitride oxide film 350 and hard mask layer 340 are etched using first photoresist pattern 370 as an etching mask to form a silicon oxynitride pattern (not shown) and a hard mask pattern (not shown). First photoresist pattern 370 and anti-reflection film 360 are removed. Interlayer insulating film 330 is etched using the silicon oxynitride pattern and the hard mask pattern as an etching mask to form an interlayer insulating pattern 330a that defines a storage node region 372. The silicon oxynitride pattern and the hard mask pattern are removed. A conductive film 375 is formed over interlayer insulating pattern 330a including storage node region 372. Conductive film 375 is selected from the group consisting of a titanium layer, a titanium nitride film and a combination thereof.

Figure 3C:
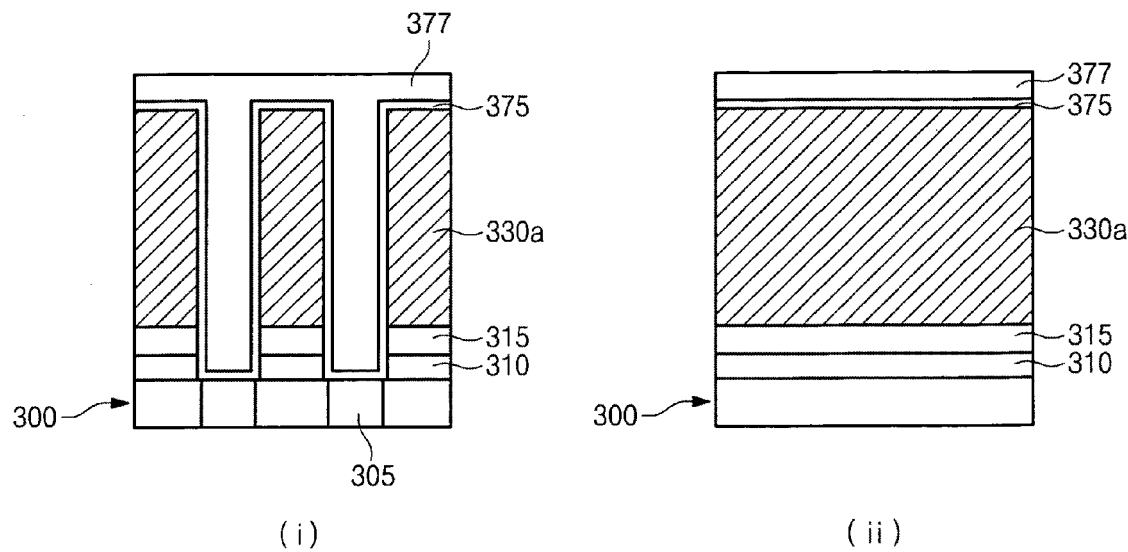
Figure 3D:
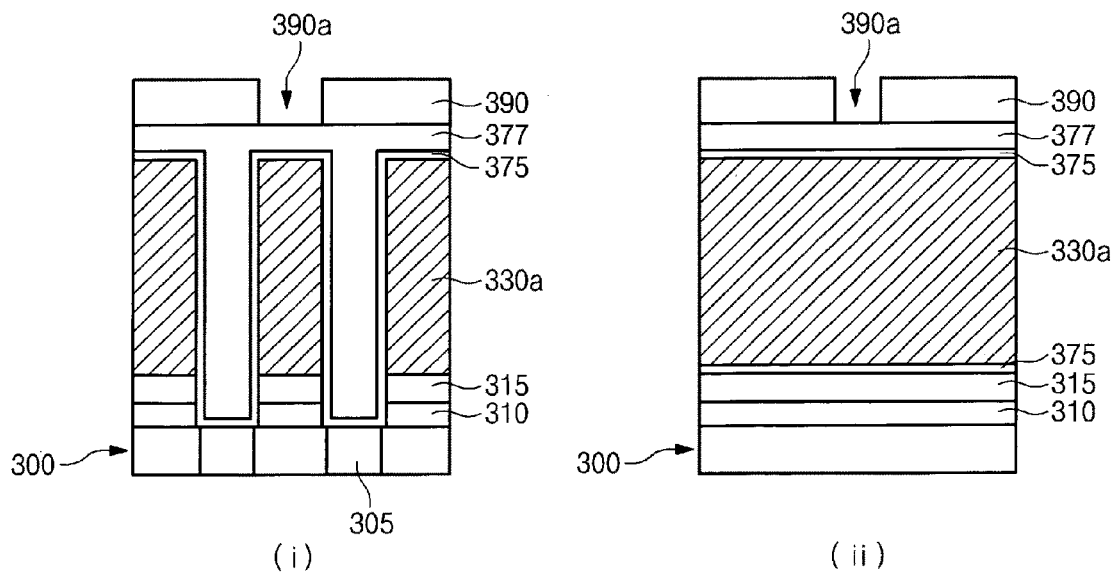

Referring to FIGS. 3c and 3d, a capping insulating film 377 is formed over conductive film 375 including storage node region 372. Capping insulating film 377 includes an oxide film. A photoresist film (not shown) is formed over capping insulating film 377. The photoresist film is exposed and developed using a mask (not shown) defining a portion between two neighboring storage node regions 372, to form a second photoresist pattern 390. An exposed region 390a of second photoresist pattern 390 is alternately formed between storage node regions 372.

Figure 3E:
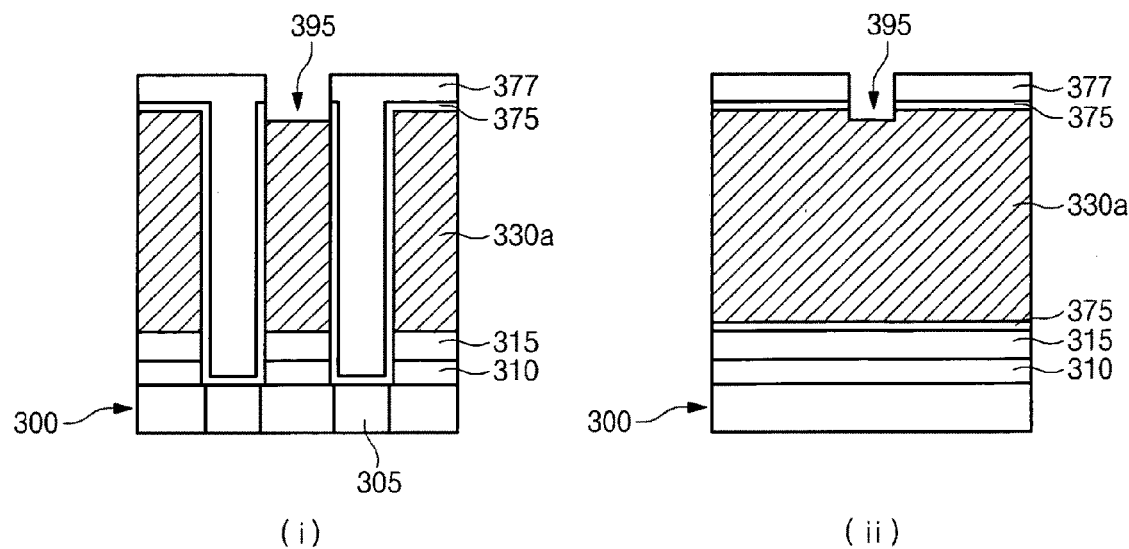
Figure 3F:
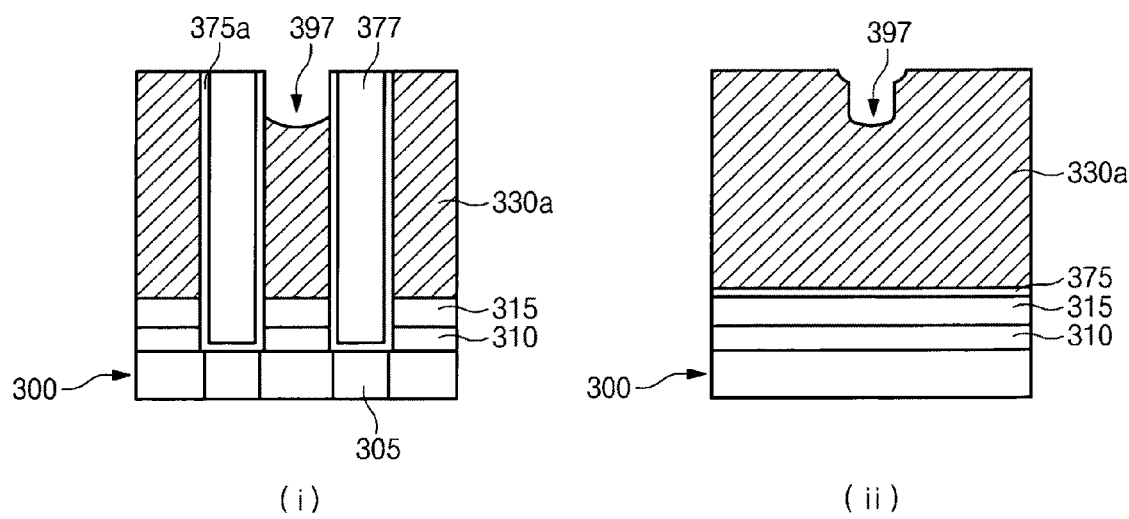

Referring to FIGS. 3e and 3f, capping insulating film 377, conductive film 375 and a portion of interlayer insulating pattern 330a are selectively etched using second photoresist pattern 390 of FIG. 3d as a mask, to form a first recess 395. Second photoresist pattern 390 is removed. A selective dip-out process is performed on exposed interlayer insulating pattern 330a on the bottom of first recess 395, to form a second recess 397 that exposes a portion of conductive film 375 over sidewalls of second recess 397.

A planarization process is performed on capping insulating film 377 and conductive film 375 until interlayer insulating pattern 330a is exposed, to form a lower storage node 375a. The planarization process is selected from a chemical mechanical polishing ("CMP") method, an etch-back method and a combination thereof. Accordingly, lower storage node 375a formed in storage node region 372 is electrically separated from neighboring lower storage node 375a.

Figure 3G:
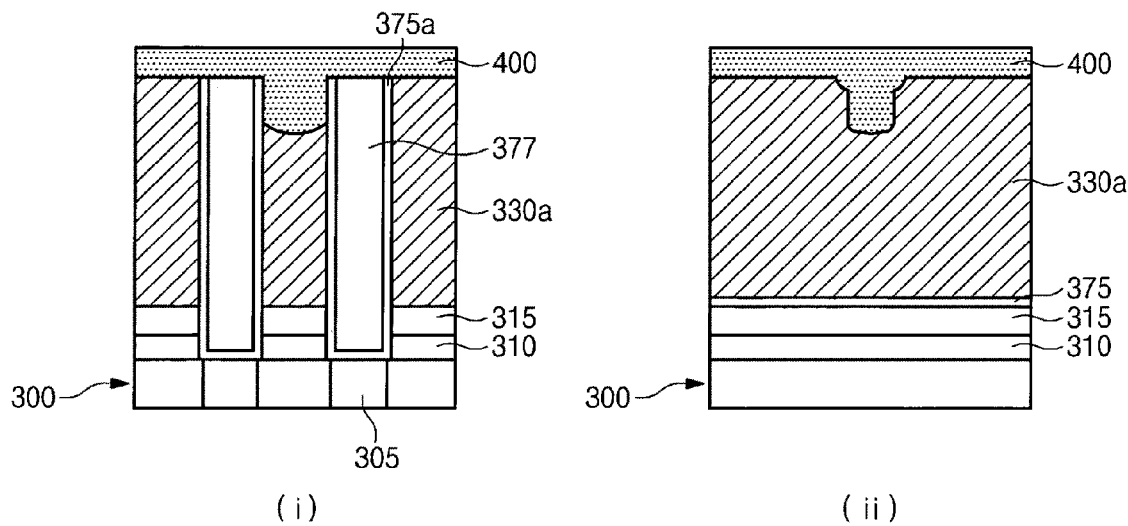
Figure 3H:
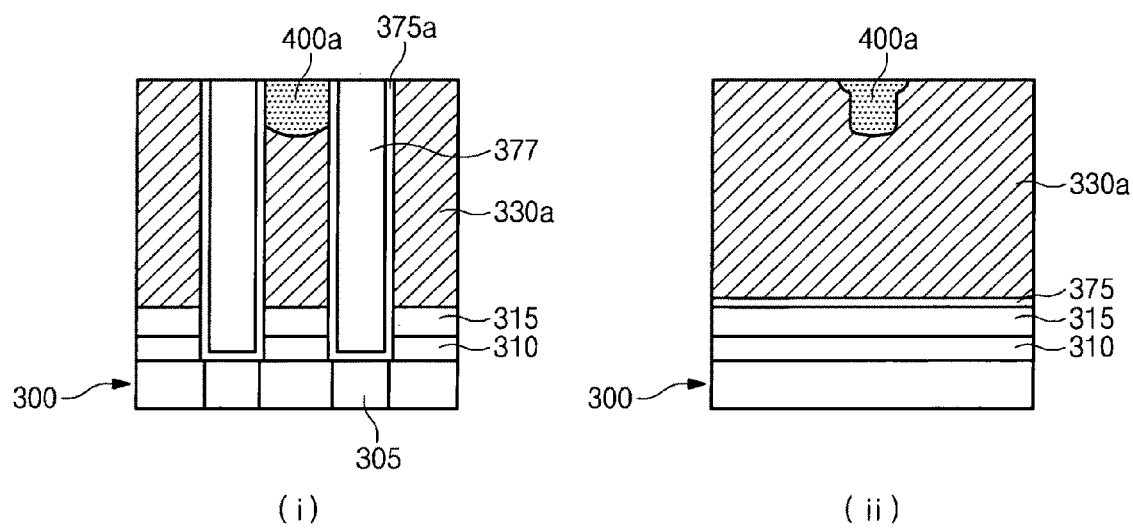
Figure 3I:
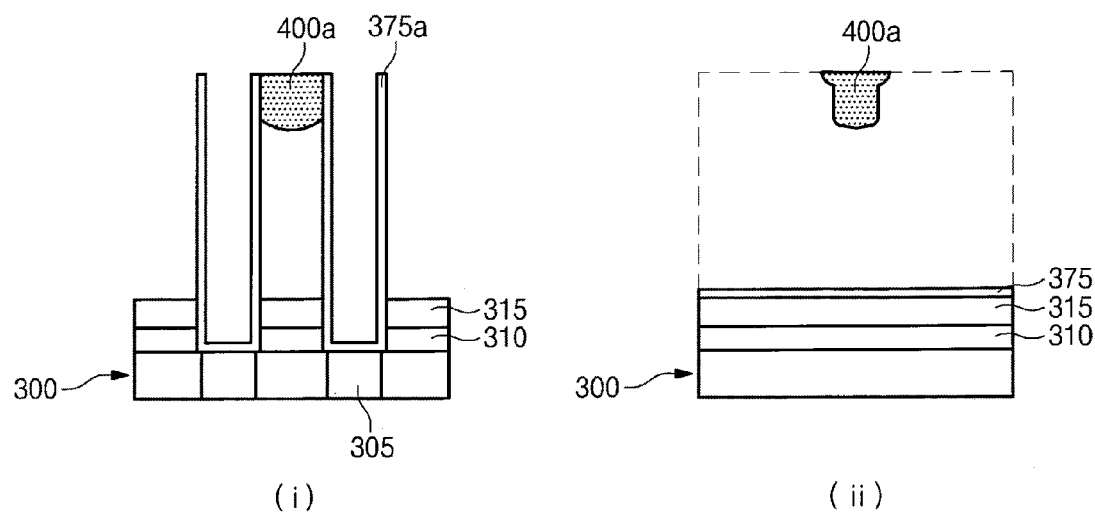

Referring to FIGS. 3g to 3i, a supporting insulating film 400 is formed over interlayer insulating film 330a including second recess 397 of FIG. 3f, lower storage node 375a and capping insulating film 377. A planarization process is performed on supporting insulating film 400 until interlayer insulating pattern 330a and capping insulating film 377 are exposed, to form a supporting pattern 400a that fills second recess 397 of FIG. 3f. The planarization process is selected from a CMP method, an etch-back method and a combination thereof.

A full dip-out process is performed to remove interlayer insulating pattern 330a and capping insulating film 377, thereby exposing cylinder-type lower storage node 375a. However, supporting pattern 400a is not removed by an etching selectivity difference between an oxide film and a nitride film. The remaining supporting pattern 400a prevents a leaning phenomenon of lower storage node 375a in the dip-out process. In the invention, although the arrangement of supporting pattern 400a is shown in FIG. 2, it is not so limited.

As described above, according to an embodiment of the invention, a supporting pattern is formed between neighboring storage nodes to prevent a leaning phenomenon of lower storage nodes in a dip-out process, thereby improving reliability and yield of devices.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor device, the method comprising:
   forming an interlayer insulating pattern over a semiconductor substrate, the interlayer insulating pattern defining a plurality of storage node regions;
   forming a lining conductive film over the interlayer insulating pattern including the storage node region;
   forming a capping insulating film over the lining conductive film;
   etching the interlayer insulating pattern, the lining conductive film and the capping insulating film between the storage node regions to form a recess exposing the interlayer insulating pattern on the bottom of the recess and the lining conductive film on sidewalls of the recess;

shaping the capping insulating film and the lining conductive film to be planar so that the lining conductive layer is electrically separated from each other to form a respective lower storage electrode;

forming a supporting pattern filling the recess; and removing the capping insulating film and the interlayer insulating pattern to expose the lower storage node.

2. The method of claim 1, further comprising forming a buffer oxide film and an etch stop film in the interface between the semiconductor substrate and the interlayer insulating pattern.

3. The method of claim 2, wherein the etch stop film comprises a nitride film.

4. The method of claim 1, wherein the supporting pattern comprises a nitride film.

5. The method of claim 1, wherein the process of forming the recess comprises:

selectively etching the lining conductive film, the capping insulating film, and a portion of the interlayer insulating pattern to form a first recess; and performing a selective dip-out process on the interlayer insulating pattern on the bottom of the first recess to form a second recess exposing a portion of the conductive film on sidewalls of the second recess.

6. The method of claim 1, wherein the lining conductive film is selected from the group consisting of a titanium layer, a titanium nitride film and a combination thereof.

* * * * *